(12) United States Patent
Gumbel et al.

(10) Patent No.: US 6,674,288 B2
(45) Date of Patent: Jan. 6, 2004

(54) VEHICLE LAMP INSPECTION SYSTEM

(75) Inventors: Matthew J. Gumbel, Fort Wayne, IN (US); Joseph A. Bell, Markle, IN (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 0 days.

(21) Appl. No.: 09/960,129

(22) Filed: Sep. 21, 2001

(65) Prior Publication Data

US 2003/0057955 A1 Mar. 27, 2003

(51) Int. Cl.$^7$ ................................................. G01R 31/00
(52) U.S. Cl. ........................................ 324/504; 324/503
(58) Field of Search ................................. 324/503, 504, 324/508, 505, 66, 539, 500, 537

(56) References Cited

U.S. PATENT DOCUMENTS

| 4,207,610 A | * | 6/1980 | Gordon | 701/35 |
| 4,866,390 A | * | 9/1989 | Butchko | 324/504 |
| 5,604,439 A | * | 2/1997 | Walkington et al. | 324/504 |
| 5,990,788 A | * | 11/1999 | Syracuse | 340/458 |
| 6,043,661 A | * | 3/2000 | Gutierrez | 324/504 |
| 6,066,951 A | * | 5/2000 | Maass | 324/414 |
| 6,154,035 A | * | 11/2000 | Aguirre et al. | 324/504 |
| 6,323,656 B2 | * | 11/2001 | Shoemaker | 324/537 |

* cited by examiner

Primary Examiner—N. Le
Assistant Examiner—John Teresinski
(74) Attorney, Agent, or Firm—Jeffrey P. Calfa; Dennis Kelly Sullivan; Susan L. Lukasik

(57) ABSTRACT

A vehicle provides the automatic activation and deactivation of vehicle lights in a predetermined sequence upon user request to assist the user in making a sight inspection of operation of the lights without further human help.

4 Claims, 4 Drawing Sheets

VEHICLE LAMP INSPECTION SYSTEM

BACKGROUND OF THE INVENTION

1. Field of the Invention

The present invention relates generally to commercial motor vehicles and more particularly to an automated system for cycling vehicle lamps on and off to allow direct sight inspection by one person both of operability of the lamp bulbs and of the systems activating the lamps.

2. Description of the Problem

Commercial trucking regulations provide for periodic inspection of various commercial vehicle systems. Among vehicle systems requiring inspection are exterior lamps, such as headlights, turn indicator lamps and identification lights. An inspection must determine not only if the lamp is operable, but that systems for actuating lamps for indicating turns, braking, or for flashing, are also functioning correctly. Performing such checks has generally been much easier if two people are available to make the check, one to remain in the cab of the vehicle to depress the brakes, activate turn signals and perform other similar operations while another person walks around the vehicle to view the lamps' operation.

Contemporary designs for the control and management of vehicle components increasingly rely on methods derived from computer networking. Digital data are exchanged between component controllers over a common physical layer such as a shielded twisted pair of wires. Intelligible communication between two or more device controllers among a greater plurality of devices, all occurring over the common physical layer, depends upon the communicating devices being able to discriminate among messages they receive and to respond to those messages directed to them. Such methods are well known in the art and are part of the standards which the Society of Automotive Engineers (SAE) has published and continues to publish as part of the SAE J1939 protocol.

The J1939 protocol provides an open protocol and a definition of the performance requirements of the medium of the physical layer, but also allows for development of proprietary protocols. The SAE J1939 protocol is a specialized application of a controller area network (CAN) and may be readily implemented utilizing commercial integrated circuits such as the C167 device from Siemens of Germany.

The CAN protocol is an ISO standard (ISO 11898) for serial data communication, particularly aimed at vehicular applications. The CAN standard includes a physical layer (including the data bus) and a data-link layer, which define useful message types, arbitration rules for bus access and methods for fault detection and fault confinement. The physical layer uses differential transmission on a twisted pair wire bus. A non-destructive bitwise arbitration is used to control access to the bus. Messages are small, at most eight bytes, and are protected by checksum error detection. Each message carries a numeric value which controls its priority on the bus, and may also serve as an identification of the contents of the message. CAN offers an error handling scheme that results in retransmitted messages when they are not properly received. CAN also provides means for removing faulty nodes from the bus. CAN further adds the capability of supporting what are termed "higher layer protocols" for standardizing startup procedures including bit rate setting, distributing addresses among participating nodes or kinds of messages, determining the layout of the messages and routines for error handling on the system level.

Digital data communications over serial data paths are an effective technique for reducing the number of dedicated communication paths between the numerous switches, sensors, devices and gauges installed on the vehicles. Multiplexing the signals to and from local controllers and switches promises greater physical simplicity through displacing much of the vehicle wiring harness, reducing manufacturing costs, facilitating vehicle electrical load management, and enhancing system reliability.

Electrical control over vehicles can be implemented by several controllers connected to and communicating over the J1939 bus. Engine controllers and body controllers may be considered to be chief among these devices. These controllers provide programmable digital data processing capacity, which can be exploited to allow both more extensive and more flexible automatic control over vehicles' systems than has heretofore been economically practical.

SUMMARY OF THE INVENTION

The invention provides a vehicle which incorporates a subsystem for the automatic activation and deactivation of vehicle lights, on user request, in a repeating predetermined sequence to assist a single individual in making a sight inspection of operation of the lights. The vehicle includes an electrical system controller including a plurality of energization output ports which may be selectively energized. The lights are connected to the energization output ports of the electrical system controller. The electrical system controller further includes a programmable microcomputer for controlling the switching on and off each of the plurality of energization output ports. A test program executes on the programmable microcomputer at user request providing repeating sequential activation and deactivation of subsets of the energization output ports connected to lights.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
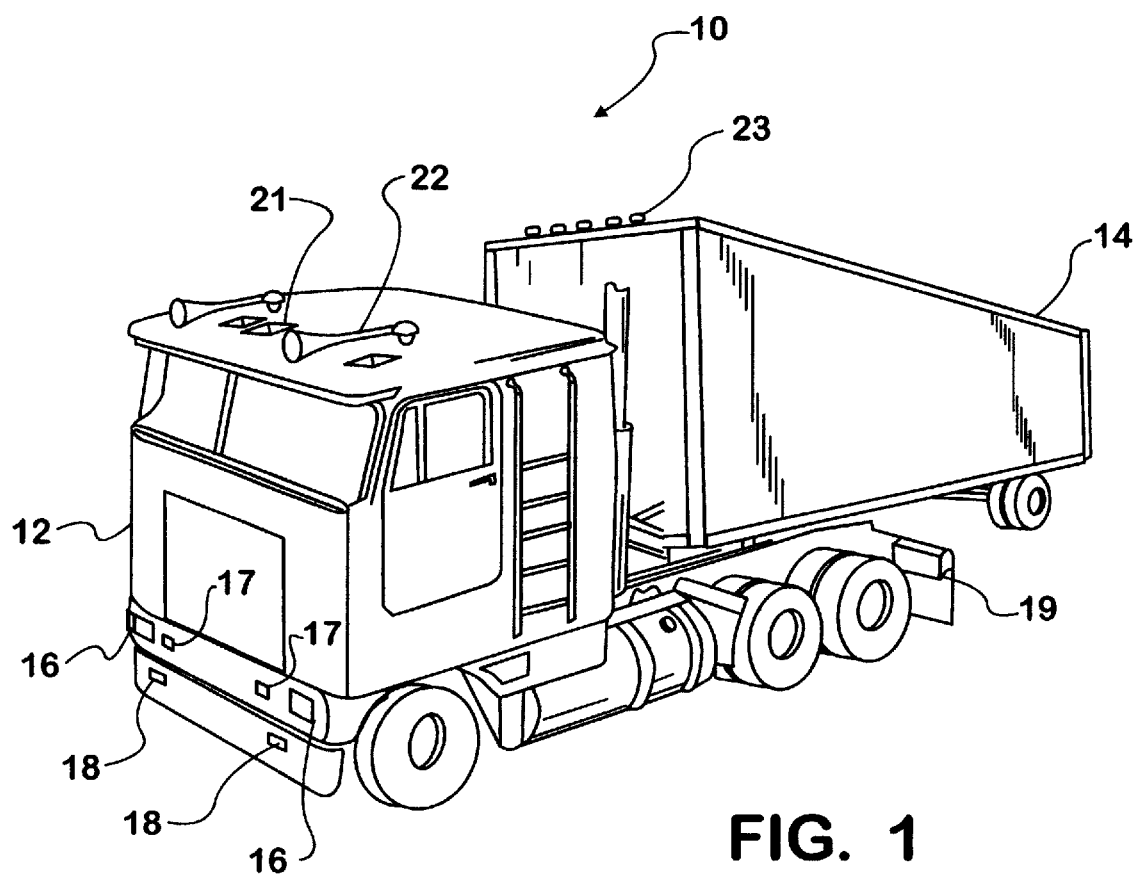
FIG. 1 is a perspective view of a tractor and trailer combination with which the present invention can be practiced.

FIG. 1 illustrates in perspective a truck 10 comprising a combination of a tractor 12 and a trailer 14. Tractor 12 includes the conventional major systems of a vehicle, including an engine, a starter system for the engine, brakes, a transmission and identification lights. Tractor 12 and trailer 14 mount several exterior lamps by which the vehicle provides light for its driver to see by and means to be seen, particularly at night, by others. On the front of tractor 12 are headlights 16, front corner turn signal lamps 17, and fog lamps 18. Several identification lights 21 are installed on the roof of tractor 12. A lamp box 19 installed on the rear end of tractor 12 carries additional turn signal lights, reverse lights and brake lights. As is common, the forward and tail end turn signal lights have a hazard function and can be cycled on and off together (generally the forward pair together and then the tail end pair together) to provide warning to passing motorists. A pair of electrically activated horns 22 are installed on the roof of tractor 12. Trailer 14 also carries various lights, including tail end brake and turn signal lamps (not shown), as well as identification lights 23 which may be positioned any where on the trailer, but are commonly found on upper and lower edges of the trailer. Operation of all lamps in all of their possible operational modes is best verified by visual inspection of the lamps in operation.

Figure 2:
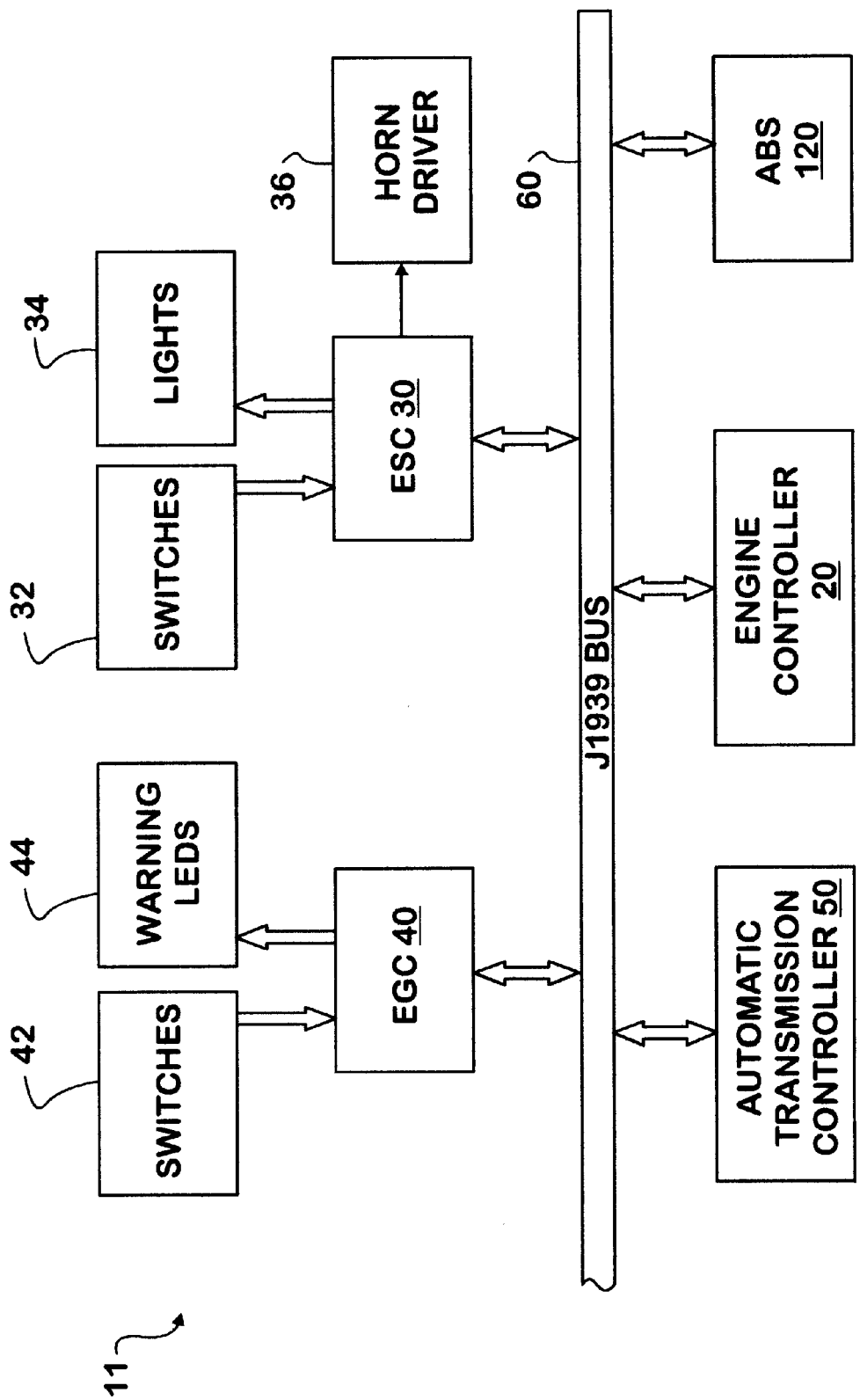
FIG. 2 is a block diagram of a vehicle controller area network used to implement the invention.

Referring now to FIG. 2, tractor 12 includes a network 11 based on an electrical system controller (ESC) 30 and including a shielded twisted pair bus 60 over which data communications between ESC 30 and other controllers occur. An electronic gauge controller 40 and ESC 30 are of primary interest to the invention. Among other vocational controllers and sensor interface modules which may be connected to bus 60 are an automatic transmission controller 50, an engine controller 20 and an antilock brake system 120. Collectively, bus 60 and the various nodes attached thereto form a controller area network (CAN).

Active vehicle components are typically controlled by one of a group of autonomous, vocational controllers. However, most lamps are powered directly from ESC 30, which includes a number of power field effect transistors (FETs) for that purpose. A switch set 42 for the lamps is attached to EGC 40, which communicates requests to ESC 30 over bus 60. Less usually, switches 32 may be directly connected to ESC 30 to provide the same control. A panel display including a plurality of warning LEDs 44 is connected to and under the control of EGC 40. ESC 30 additionally drives horn transducers 36 mounted in the horns 22 on top of tractor 12. ESC 30 includes a programmable computer including conventional memory (both volatile and non-volatile) and program execution capacities (CPU 31, see FIG. 3).

Figure 3:
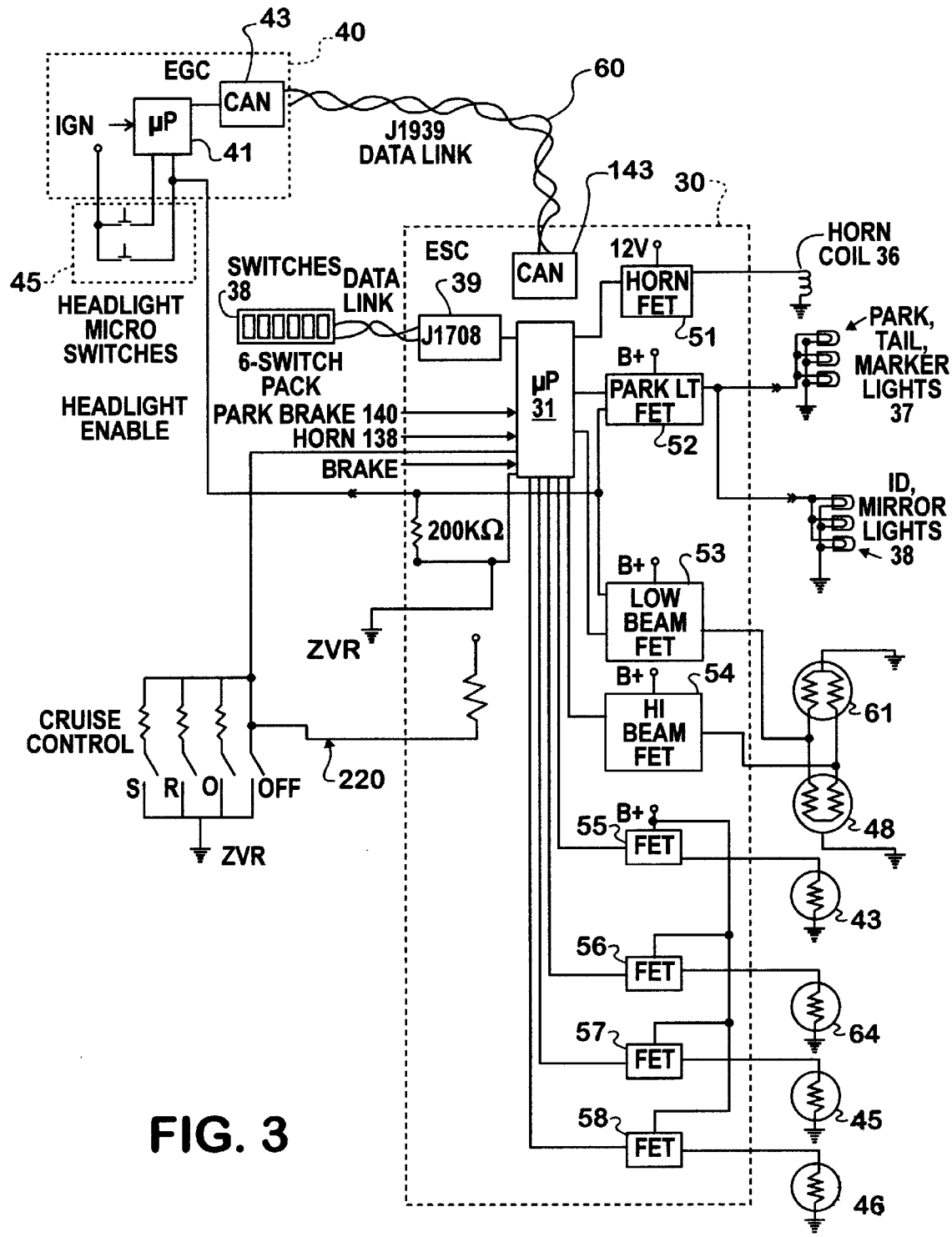
FIG. 3 is a high level circuit schematic of an electronic gauge controller, an electrical system controller and a plurality of lamps energized under the control of the electrical system controller.

FIG. 3 is a high level circuit schematic of EGC 40, ESC 30, and a plurality of lamps energized under the control of the ESC as configured for a preferred embodiment of the invention. ESC 30 is a programmable body systems computer used to control many vehicle electrical system functions. In the past, many of these functions were controlled by switches, relays and other independently wired and powered devices. ESC 30 is based on a microprocessor 31 which executes programs and which controls switching of a plurality of power FETs used to actuate vehicle exterior lights and the horn. EGC 40 communicates with ESC 30 over an SAE J1939 data link (bus 60) and CAN controllers 43 and 143. EGC 40 is based on a microprocessor 41 but includes only limited and typically fixed programming. EGC 40 handles switch 45 inputs providing manual control over headlights and enablement of the headlights 16. Another source of switch inputs may by provided by a switch pack 38 which is connected to microprocessor over an SAE J1708 bus and controller 39 or through switches associated with brake pedals, turn signal levers and other similar systems.

Activation of a lamp test routine begins with movement of the ignition to the "ON" position, detected by microprocessor 41 of EGC 40, and with an arbitrary sequence of inputs from other switches connected to microprocessor 31, including a set of cruise control switches in a voltage divider network 220, park brake set switch 140 and horn switch 138. A sequence of actuation of these switches trigger the lamp test cycle. Alternatively, a switch mounted in switch pack 38 may be used to start the lamp test cycle. A preferred trigger sequence of switches is to move the ignition key to the start position, set the parking brake and then simultaneously press cruise on and cruise resume switches followed by depressing the horn button. Cancellation of the cycle comes on a time out condition, or by meeting any number of other conditions, such as moving the ignition to the "OFF" position, tapping the brakes, turning on the headlights, etc. Some of these signals, such as the brake signal may be communicated from ESC 30.

Microprocessor 31 can apply activation signals to all of the lamps subject to inspection as well as to a horn coil 36. In the case of headlights 16, this may also involve pulling high a headlight enable line by instruction to EGC 40. Microprocessor 31 is connected to provide an activation signal to a horn power FET 51 which in turn drives a horn coil 36. Another signal line from microprocessor 31 is connected to drive a park light FET 52 which in turn drives park/tail/marker light bulbs 37, a license plate ID and mirror light bulbs 38. Yet another signal line from microprocessor 31 drives a low beam FET 53, which in turn drives filaments in headlight bulbs 41 and 48. Low beam FET 53 and park light FET 52 further require an input on the headlight enable line to operate. Still another pin on microprocessor 31 controls a high beam FET 54 which drives high beam filaments in bulbs 41 and 42. Lastly, a set of four pins on microprocessor 31 are used to control the turn signal lights at each corner of the vehicle. Four FETs 55, 56, 57 and 58 are connected to receive the signals and, in turn, to power bulbs 43, 44, 45, and 46 mounted in turn signal fixtures at the four corners of the vehicle. FETs 55, 56, 57 and 58 can be activated together or separately to provide turn indications and emergency flasher operation.

Figure 4:
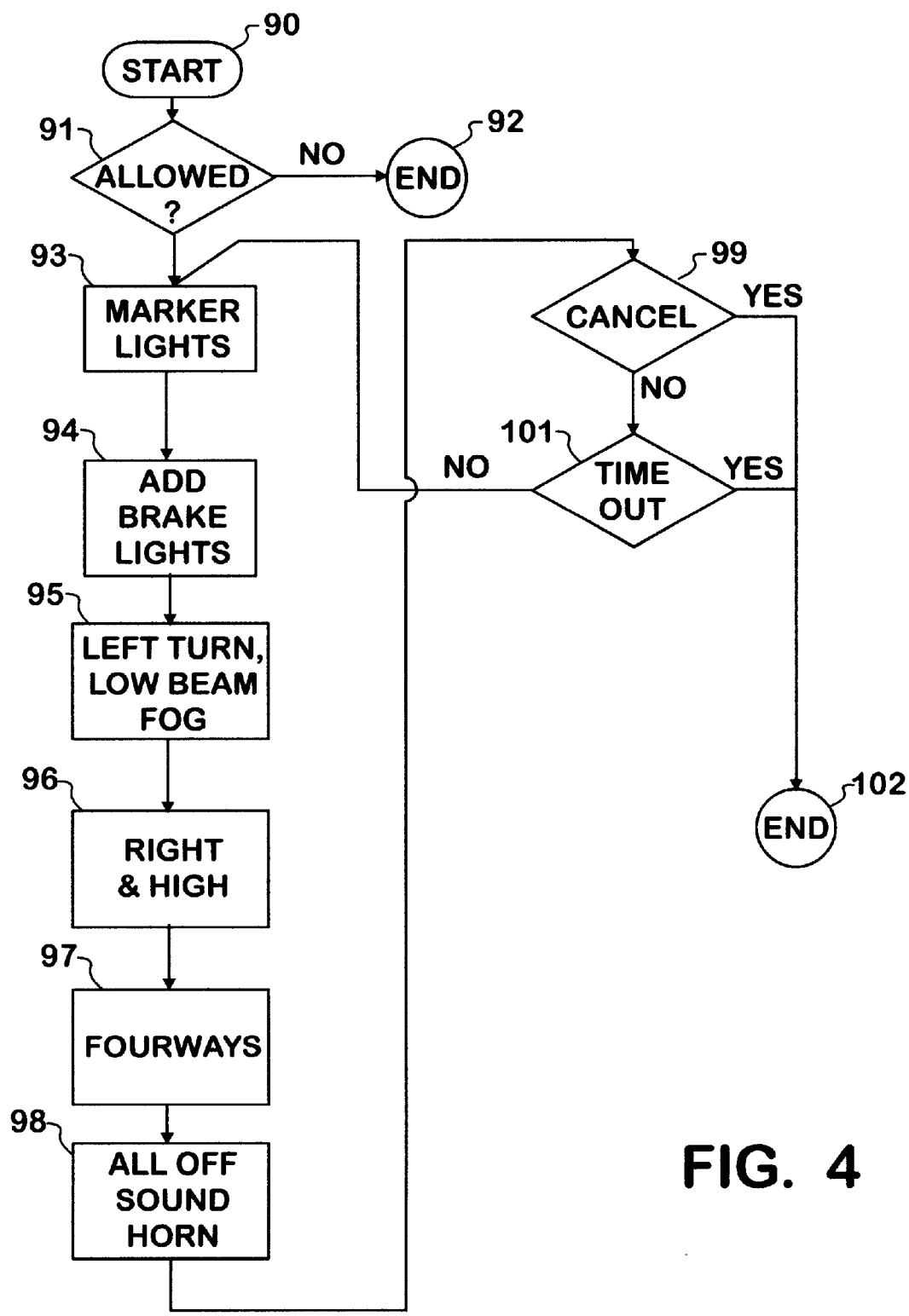
FIG. 4 is a flow chart illustrating a sequential light actuation system for one embodiment of the invention.

FIG. 4 is a high level flow chart which illustrates the testing cycle for the lamps and drive circuitry beginning with turning the ignition on and setting the park brake (step 90). If the test conditions are not met at step 91 the cycle is never initiated (end step 92). However, if the cruise control ON and RESUME buttons are simultaneously hit and the horn activated as determined at step 91, the testing cycle begins with activating output FETs for the marker lights and work light (if so equipped) for two seconds (step 93). Then, the FETs for the marker lights are left on, the PET for the brake lights is activated for two seconds and the work light turned off (step 94). Next, at step 95, the FET for the marker lights are left on, the brake lights turned off, the left turn signal is cycled an and off, the low beams, the work light and fog lamps are activated for two seconds. Next, at step 96, the left turn signal is canceled, the work light turned off and the tight turn signal is turned on.. The high beams are turned on. At step 97 all of the lights on at step 96 are timed off and the four bulbs constituting the corner turn light are flashed in unison (or front to back) to test flasher operation. The work light is turned on again. Finally, at step 98 all of the lights are turned off and the horn is sounded. Next, at step 99 it is checked to determine if the operator has canceled the operation of the test system. This step can occur after each functional step. If operation has not been canceled it may be determined if the process has timed out (step 101). Following the YES branch from either of steps 99 or 101 cancels the procedure. The NO branch restarts the cycle. The test loops, causing each set of power FETs to be repeated in the same sequence until cancellation. While in theory the sequence could be varied, a fixed sequence is simpler to implement and use. The time out period is preferably set to about five minutes to provide ample time for the user the view the entire vehicle.

The present invention enables a vehicle operator to perform a light check of a vehicle with the assistance of a second person. This in turn saves both time and helps insure completeness of the inspection. The test feature can also be used during vehicle manufacture to ensure that electrical connections to exterior bulbs have been correctly made.

While the invention is shown in only one of its forms, it is not thus limited but is susceptible to various changes and modifications without departing from the spirit and scope of the invention.

What is claimed is:

1. A vehicle comprising:

a controller area network;

an electrical system controller electrically coupled to the controller area network and including a plurality of energization output ports which may be selectively energized;

a gauge controller connected to the controller area network for providing data to the electrical system controller over the controller area network;

an ignition switch position sensing element providing an input to the gauge controller;

cruise control input switches connected to the electrical system controller;

a horn input switch connected to the electrical system controller;

a plurality of exterior lights connected to the energization output ports of the electrical system controller;

the electrical system controller further including a programmable microcomputer for switching on and off each of the plurality of energization output ports;

a test program executable on the programmable microcomputer resulting in the sequential activation and deactivation of subsets of the energization output ports connected to lights; and a predetermined combination of ignition switch position and sequence of cruise control input switches and horn input switches for triggering execution of the test program.

2. A vehicle as claimed in claim 1, further comprising;

a light switch connected to the gauge controller;

a park brake position switch connected to the electrical system controller;

a brake position switch connected to the electrical system controller;

program means for detecting a change in state of one of the brake position switch, the park brake position switch, and the light switch for terminating execution of the test program.

3. A vehicle as claimed in claim 2, wherein the test program further comprises a loop for causing the sequential activation and deactivation of the energization output ports to repeat.

4. A vehicle as claimed in claim 3, further comprising a timer for terminating repetition of the test program.

* * * * *